US010619126B2

(12) United States Patent
Sugishima et al.

(10) Patent No.: US 10,619,126 B2
(45) Date of Patent: Apr. 14, 2020

(54) CLEANING COMPOSITIONS AND METHODS OF USE THEREFOR

(71) Applicant: FUJIFILM ELECTRONIC MATERIALS U.S.A., INC., N. Kingstown, RI (US)

(72) Inventors: Yasuo Sugishima, Gilbert, AZ (US); Keeyoung Park, Gilbert, AZ (US); Thomas Dory, Gilbert, AZ (US)

(73) Assignee: Fujifilm Electronic Materials U.S.A., Inc., N. Kingstown, RI (US)

(*) Notice: Subject to any disclaimer, the term of this patent is extended or adjusted under 35 U.S.C. 154(b) by 8 days.

(21) Appl. No.: 15/743,529

(22) PCT Filed: Jul. 14, 2016

(86) PCT No.: PCT/US2016/042190
§ 371 (c)(1),
(2) Date: Jan. 10, 2018

(87) PCT Pub. No.: WO2017/011617
PCT Pub. Date: Jan. 19, 2017

(65) Prior Publication Data
US 2018/0201884 A1   Jul. 19, 2018

Related U.S. Application Data

(60) Provisional application No. 62/192,243, filed on Jul. 14, 2015.

(51) Int. Cl.
| | | |
|---|---|---|
| *C11D 7/32* | (2006.01) | |
| *C11D 11/00* | (2006.01) | |
| *C11D 7/26* | (2006.01) | |
| *C23G 5/032* | (2006.01) | |
| *G03F 7/42* | (2006.01) | |
| *C11D 7/08* | (2006.01) | |
| *H01L 21/02* | (2006.01) | |
| *C11D 7/50* | (2006.01) | |
| *C11D 7/24* | (2006.01) | |

(52) U.S. Cl.
CPC ............ *C11D 11/0047* (2013.01); *C11D 7/08* (2013.01); *C11D 7/247* (2013.01); *C11D 7/26* (2013.01); *C11D 7/3209* (2013.01); *C11D 7/3281* (2013.01); *C11D 7/5004* (2013.01); *C11D 7/5022* (2013.01); *C23G 5/032* (2013.01); *G03F 7/423* (2013.01); *G03F 7/425* (2013.01); *H01L 21/02057* (2013.01)

(58) Field of Classification Search
CPC ..... C11D 11/0047; C11D 7/08; C11D 5/5022; C11D 3/43; C11D 7/50; C11D 7/263
USPC ........................................................ 510/175
See application file for complete search history.

(56) References Cited

U.S. PATENT DOCUMENTS

| | | | |
|---|---|---|---|
| 6,372,410 B1 | 4/2002 | Ikemoto et al. | |
| 2002/0146647 A1 | 10/2002 | Aoki et al. | |
| 2003/0148910 A1 | 8/2003 | Peters et al. | |
| 2005/0003977 A1* | 1/2005 | Itano | C11D 3/26 510/175 |
| 2006/0003910 A1* | 1/2006 | Hsu | C23F 11/141 510/176 |
| 2006/0138399 A1* | 6/2006 | Itano | C11D 7/08 257/40 |
| 2006/0293208 A1 | 12/2006 | Egbe et al. | |
| 2007/0087949 A1 | 4/2007 | Wu et al. | |
| 2007/0149430 A1 | 6/2007 | Egbe et al. | |
| 2008/0004197 A1 | 1/2008 | Kneer | |
| 2008/0242574 A1 | 10/2008 | Rath et al. | |
| 2008/0261847 A1* | 10/2008 | Visintin | H01L 21/02079 510/176 |
| 2010/0112728 A1* | 5/2010 | Korzenski | H01L 21/02079 438/3 |
| 2010/0163788 A1 | 7/2010 | Visintin et al. | |
| 2010/0203735 A1* | 8/2010 | Nakamura | C11D 7/3281 438/707 |
| 2014/0087313 A1* | 3/2014 | Ueno | G03F 7/425 430/323 |
| 2015/0111804 A1 | 4/2015 | Dory et al. | |

FOREIGN PATENT DOCUMENTS

| | | | |
|---|---|---|---|
| CN | 1296064 | 5/2001 | ............. G11D 7/26 |
| CN | 1678961 | 10/2005 | ............. G03F 7/42 |
| CN | 102827707 | 12/2012 | ............. C11D 7/26 |
| CN | 102981377 | 3/2013 | ............. G03F 7/42 |
| EP | 1 091 254 | 4/2001 | ............. G03F 7/42 |
| EP | 2 759 881 | 7/2014 | ............. G03F 7/42 |
| JP | 2007-16232 | 1/2007 | ............. C11D 7/32 |
| JP | 2007-128064 | 5/2007 | ............. G03F 7/42 |
| JP | 2009-21516 | 1/2009 | ........... H01L 21/304 |
| JP | 2010-515246 | 5/2010 | ........... H01L 21/304 |

(Continued)

OTHER PUBLICATIONS

The Written Opinion and Search Report from the Singapore Patent Office for Singapore Application No. 11201800218U dated May 27, 2019.
Fouda et al., "Anhydride Derivatives as Corrosion Inhibitors for Carbon Steel in Hydrochloric Acid Solutions", *International Journal of Electrochemical Science*, vol. 8, pp. 8823-8847 (Jun. 1, 2013).
The International Preliminary Report on Patentability for International Application No. PCT/US2016/042190 dated Jan. 25, 2018.
Supplementary European Search Report for European Application No. EP 16 82 5152 dated Jun. 5, 2018 (9 pages).
International Search Report for PCT/US2016/042190 dated Oct. 19, 2016.2 pages.

(Continued)

*Primary Examiner* — Gregory E Webb
(74) *Attorney, Agent, or Firm* — Fish & Richardson P.C.

(57) ABSTRACT

The present disclosure is directed to non-corrosive cleaning compositions that are useful primarily for removing residues (e.g., plasma etch and/or plasma ashing residues) and/or metal oxides from a semiconductor substrate as an intermediate step in a multistep manufacturing process.

78 Claims, No Drawings

(56) References Cited

FOREIGN PATENT DOCUMENTS

| TW | 201336973 | 9/2013 | ............. C09K 13/08 |
| TW | 201516589 | 5/2015 | ............... G03F 7/42 |
| WO | WO 2007/120259 | 10/2007 | ............... C11D 3/20 |
| WO | 2012171324 A1 | 12/2012 | |
| WO | WO 2013/101907 | 7/2013 | ............ H01L 21/311 |
| WO | WO 2015/060954 | 4/2015 | |

OTHER PUBLICATIONS

Office Action from the Chinese Patent Office for Chinese Application No. 201680041416.5, dated Jul. 23, 2019, and its machine English translation.
Taiwan Official Letter and Search Report for Taiwan Application No. TW 105122061 dated Dec. 9, 2019 (with English Summary).
Japanese Office Action for Japanese Application No. JP 2018-501912 dated Jan. 31, 2020 (with English Translation).

* cited by examiner

CLEANING COMPOSITIONS AND METHODS OF USE THEREFOR

CROSS-REFERENCE TO RELATED APPLICATION APPLICATIONS

The present application is a U.S. National Phase Application under 35 U.S.C. § 371 of International Application PCT/US2016/042190, filed on Jul. 14, 2016, which claims the benefit of U.S. Provisional Application Ser. No. 62/192,243, filed on Jul. 14, 2015. The contents of the parent applications are incorporated herein by references in their entireties.

FIELD OF THE DISCLOSURE

The present disclosure relates generally to compositions and processes to remove residues from semiconductor substrates during manufacturing of semiconductor devices. The compositions of the disclosure are useful for removing etch residues and/or metal oxides from substrates in the presence of other materials, such as metal conductors, barrier materials, insulator materials, and exposed or underlying layers of copper, tungsten, and low-k dielectric materials.

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

Metal layers (or metal films) are generally susceptible to corrosion. For example, metals or metal alloys such as aluminum, copper, aluminum-copper alloy, tungsten nitride, tungsten (W), cobalt (Co), titanium oxide, other metals and metal nitrides, will readily corrode and dielectrics [ILD, ULK] can etch by using conventional cleaning chemistries. In addition the amount of corrosion tolerated by the integrated circuit device manufacturers is getting smaller and smaller as the device geometries shrink.

At the same time as residues become harder to remove and corrosion must be controlled to ever lower levels, cleaning solutions must be safe to use and environmentally friendly.

Therefore, the cleaning solution should be effective for removing the plasma etch and plasma ash residues and must also be non-corrosive to all exposed substrate materials.

SUMMARY OF THE DISCLOSURE

The present disclosure is directed to non-corrosive cleaning compositions that are useful primarily for removing etch residues (e.g., plasma etch and/or plasma ashing residues) and/or metal oxides from a semiconductor substrate as an intermediate step in a multistep manufacturing process. These residues include a range of relatively insoluble mixtures of organic compounds like residual photoresist, organometallic compounds, metal oxides which are formed as reaction by-products from exposed metals or metal alloys such as aluminum, aluminum/copper alloy, copper, titanium, tantalum, tungsten, cobalt, metal nitrides such as titanium and tungsten nitrides, and other materials. The cleaning compositions described herein can remove a broad range of residues encountered on semiconductor substrates and are generally non-corrosive to exposed substrate materials (e.g., exposed metals or metal alloys such as aluminum, aluminum/copper alloy, copper, titanium, tantalum, tungsten, cobalt, and metal nitrides such as titanium and tungsten nitrides).

In one embodiment, the disclosure features compositions including: a) HF; b) at least one organic solvent; c) at least one corrosion inhibitor selected from triazoles, aromatic anhydrides, and combinations thereof; and d) water.

In another embodiment, the disclosure features methods for cleaning semiconductor substrates. Such methods can be performed, for example, by contacting a semiconductor substrate containing post etch residues and/or post ash residues with a cleaning composition of the present disclosure.

In still another embodiment, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

In one embodiment, the disclosure describes a composition including: a) HF; b) at least one organic solvent; c) at least one corrosion inhibitor selected from triazoles, aromatic anhydrides, and combinations thereof; and d) water.

In some embodiments, the compositions of this disclosure contain at least one corrosion inhibitor selected from substituted or unsubstituted benzotriazoles. Without wishing to be bound by theory, it is believed that such compositions can exhibit significantly improved compatibility with TiOx that may be present in the semiconductor substrate compared to compositions without any corrosion inhibitor.

Suitable classes of substituted benzotriazole include, but are not limited to, benzotriazoles substituted with alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups.

Suitable benzotriazoles for use as a corrosion inhibitor include, but are not limited to, benzotriazole (BTA), 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

In some embodiments of the disclosure, the compositions include aromatic anhydrides. As used herein, "aromatic anhydride" refers to a molecule containing at least one 5- or 6-membered aromatic ring and an anhydride moiety in the same molecule. In some embodiments, the compositions of this disclosure contain at least one corrosion inhibitor selected from benzoic anhydrides and phthalic anhydrides. In certain embodiments, the benzoic anhydride is 2-sulfobenzoic anhydride.

In some embodiments, the compositions of this disclosure include at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the corrosion inhibitor.

In some embodiments, the compositions of this disclosure include at least two (e.g., two, three, four, or more) corrosion inhibitors described herein. Without wishing to be bound by theory, it is believed that such compositions can exhibit significantly improved compatibility with SiN that may be present in the semiconductor substrate.

The compositions of this disclosure contain at least one organic solvent. In some embodiments, the organic solvent is selected from the group consisting of alcohols, ketones, esters, and ethers (e.g., glycol diethers). In some embodiments, the compositions of this disclosure contain at least two (e.g., two, three, four, or more) organic solvents.

Classes of alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and alcohols (e.g., low molecular weight alcohols) containing a ring structure.

Examples of alkane diols includes, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols.

Examples of alkylene glycols include, but are not limited to, ethylene glycol, propylene glycol, diethylene glycol, dipropylene glycol, triethylene glycol and tetraethyleneglycol.

Examples of alkoxyalcohols include, but are not limited to, 3-methoxy-3-methyl-1-butanol, 3-methoxy-1-butanol, 1-methoxy-2-butanol, and glycol monoethers.

Examples of glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of unsaturated non-aromatic monohydric alcohols include, but are not limited to, allyl alcohol, propargyl alcohol, 2-butenyl alcohol, 3-butenyl alcohol, and 4-penten-2-ol.

Examples of alcohols containing a ring structure include, but are not limited to, tetrahydrofurfuryl alcohol, furfuryl alcohol, and 1,3-cyclopentanediol.

Examples of ketones include, but are not limited to, acetone, cyclobutanone, cyclopentanone, diacetone alcohol, 2-butanone, 5-hexanedione, 1,4-cyclohexanedione, 3-hydroxyacetophenone, 1,3-cyclohexanedione, and cyclohexanone.

Examples of esters include, but are not limited to, ethyl acetate, glycol monoesters (such as ethylene glycol monoacetate and diethyleneglycol monoacetate), and glycol monoether monoesters (such as propylene glycol monomethyl ether acetate, ethylene glycol monomethyl ether acetate, propylene glycol monoethyl ether acetate, and ethylene glycol monoethyl ether acetate).

In certain embodiments, the compositions of the disclosure include at least about 95 wt % total organic solvent.

The compositions of the present disclosure include water. In certain embodiments, the water is de-ionized and ultrapure, contains no organic contaminants and has a minimum resistivity of about 4 to about 17 mega Ohms. In some embodiments, the resistivity of the water is at least about 17 mega Ohms. In some embodiments, the compositions of this disclosure include about 0.5 wt % to about 2 wt % of water.

In some embodiments, the compositions of the present disclosure may contain additives such as, additional corrosion inhibitors, surfactants, additional organic solvents, biocides, and defoaming agents as optional components.

Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Optional surfactants may be cationic, anionic, nonionic or amphoteric.

In some embodiments, the etching compositions of the present disclosure may specifically exclude one or more of the additive components, in any combination, if more than one. Such components are selected from the group consisting of oxygen scavengers, quaternary ammonium salts including quaternary ammonium hydroxides, amines, alkaline bases (such as NaOH, KOH, and LiOH), surfactants other than a defoamer, a defoamer, fluoride-containing compounds other than HF, abrasives, hydroxycarboxylic acids, carboxylic and polycarboxylic acids lacking amino groups, buffering agents, and non-azole corrosion inhibitors.

The compositions of this disclosure may be prepared by simply mixing the components together, or may be prepared by blending two compositions in a kit.

In one embodiment of the present disclosure, there are provided methods for cleaning a semiconductor substrate. Such methods can be performed, for example, by contacting the semiconductor substrate containing post etch residues and/or post ash residues with a cleaning composition of the disclosure. In some embodiments, the method includes rinsing the substrate after the contacting step.

In some embodiments, the method does not substantially remove Co, SiN, or Cu in the semiconductor substrate. For example, the method does not remove more than about 5% by weight (e.g., more than about 3% by weight or more than about 1% by weight) of Co, SiN, or Cu in the semiconductor substrate.

In some embodiments, the etching method further includes forming a semiconductor device (e.g., an integrated circuit device such as a semiconductor chip) from the semiconductor substrate obtained by the method described above.

Semiconductor substrates typically are constructed of silicon, silicon germanium, Group III-V compounds like GaAs, or any combination thereof. The semiconductor substrates may additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrate may also contain layers of interlayer dielectrics, silicon oxide, silicon nitride, silicon carbide, titanium oxide, and carbon doped silicon oxides.

The semiconductor substrate can be contacted with the composition of the disclosure by any suitable method, such as placing the composition into a tank and immersing and/or submerging the semiconductor substrates into the composition, spraying the composition onto the semiconductor substrate, streaming the composition onto the semiconductor substrate, or any combinations thereof. In some embodiments, the semiconductor substrate is immersed into the composition.

The compositions of the present disclosure may be effectively used up to a temperature of about 85° C. In some embodiments, the compositions can be used from about 20° C. to about 80° C. In some embodiments, the compositions can be employed in the temperature range from about 55° C. to about 65° C. In some embodiments, a temperature range of about 60° C. to about 65° C. is employed.

Ranges of time in which the semiconductor substrate is in contact with the compositions of the disclosure can vary widely depending on the particular method, thickness and temperature employed. In an immersion batch type process, a suitable time range is, for example, up to about 10 minutes. In some embodiments, a range for a batch type process is from about 1 minute to about 7 minutes. In some embodiments, a time range for a batch type process is from about 1 minute to about 5 minutes. In some embodiments, a time range for a batch type process is from about 2 minutes to about 4 minutes.

The amount of time in which a single wafer is in contact with a composition of the disclosure may range from about 30 seconds to about 5 minutes. In some embodiments, a time for a single wafer process may range from about 30 seconds to about 4 minutes. In some embodiments, a time for a single wafer process may range from about 1 minute to about 3 minutes. In some embodiments, a time for a single wafer process may range from about 1 minute to about 2 minutes.

To further promote the cleaning ability of the compositions of the present disclosure, mechanical agitation means may be employed. Examples of suitable agitation means include circulation of the composition over the substrate, streaming or spraying the composition over the substrate, and ultrasonic or megasonic agitation during the cleaning process. The orientation of the semiconductor substrate relative to the ground may be at any angle. Horizontal or vertical orientations are preferred.

Subsequent to the cleaning, the semiconductor substrate is optionally rinsed with a suitable rinse solvent for about 5 seconds up to about 5 minutes with or without agitation means. Multiple rinse steps employing different rinse solvents may be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) may be employed. Examples of rinse solvents include, but are not limited to, dilute aqueous ammonium hydroxide, DI water, methanol, ethanol and isopropyl alcohol. In some embodiments, the rinse solvents are dilute aqueous ammonium hydroxide, DI water and isopropyl alcohol. In some embodiments, the rinse solvents are dilute aqueous ammonium hydroxide and DI water. The solvent may be applied using means similar to that used in applying a composition described herein. The composition of the disclosure may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 300 rpm unless otherwise noted.

General Procedure 1

Formulation Blending

Samples of cleaning compositions were prepared by adding, while stirring, to the calculated amount of organic solvent the remaining components of the formulation. After a uniform solution was achieved, optional additives, if used, were added.

General Procedure 2

Cleaning Evaluation with Beaker Test

The cleaning of PER (Post Etch Residue) from a substrate was carried out with the described cleaning compositions using a multilayered substrate of photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume Teflon beaker containing approximately 200 milliliters of the cleaning compositions of the present disclosure. Prior to immersion of the coupon into the cleaning composition, the composition was pre-heated to the desired test condition temperature (typically 40° C. or 60° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 30 seconds, and then quickly removed, and rinsed under a DI water stream at ambient temperature for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage no greater than about 2 hours. The scanning electron microscopy (SEM) images were then collected for key features on the cleaned test coupon device surface.

General Procedure 3

Materials Compatibility Evaluation with Beaker Test

The blanket Co on silicon substrate, W on silicon substrate, TiOx on SiO$_2$ on silicon substrate, SiN on silicon substrate, ILD on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000X. The test coupons were then installed on the 4" long plastic locking tweezers and treated as described in the cleaning procedure in General Procedure 3 with the Co, W, TiOx, SiN, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000X.

Example 1

Formulations Examples 1 and 2 and Comparative Formulation Example 1 were prepared according to General Procedure 1, and evaluated according to General Procedures 2 and 3. The results are summarized in Table 1.

TABLE 1

|  | Comparative Formulation Example 1 | Formulation Example 1 | Formulation Example 2 |
|---|---|---|---|
| HF, 49% | 0.28% | 0.28% | 0.28% |
| Cyclohexanone | 99.44% | 99.39% | 99.43% |
| BTA |  | 0.05% |  |
| 2-Sulfobenzoic anhydride |  |  | 0.01% |
| Water Content: | 0.28% | 0.28% | 0.28% |
| Total | 100.00% | 100.00% | 100.00% |
| Material | Etch Rates | Etch Rates | Etch Rates |
| TiOx, A/min | 11.3 | 6.6 | 7.8 |
| W alloys, A/min | <1 | <1 | <1 |
| PECVD SiN, A/min | <1 | <1 | <1 |
| Cu, A/min | 1.5 | 2.4 | 7.5 |
| Al, A/min | 3.0 | 3.2 | <1 |
| CVD SiN, A/min | <1 | NA | <1 |
| Co | <1 | NA | 2.5 |
| SiC | <1 | NA | <1 |
| W | <1 | NA | <1 |
| Low-k ILD | <1 | NA | <1 |
| Temperature | 35 | 35 | 35 |

Table 1 demonstrates the markedly improved TiOx compatibility of formulations of the disclosure compared to a formulation without a corrosion inhibitor of the disclosure.

Example 2

Formulations Examples 3 and 4 were prepared according to General Procedure 1, and evaluated according to General Procedures 2 and 3. The results are summarized in Table 2.

TABLE 2

| Composition [wt %] | Formulation Example 3 | Formulation Example 4 |
|---|---|---|
| HF | 0.85% | 0.85% |
| Tripropyleneglycol methylether | 98.22% | 97.92% |
| 2-sulfobenzoic anhydride | 0.00% | 0.30% |
| 5MBTA | 0.05% | 0.05% |
| Water Content: | 0.88% | 0.88% |
| Total | 100.00% | 100.00% |
| Etch Rates [T0] | A/min | A/min |
| SiN | >16.5 | 7.0 |
| Co | not measured | not measured |
| SiO$_2$ | not measured | not measured |
| ER test condition | 50 C. | 50 C. |
| Solution appearance during/after mixing | Clear | Clear |

Table 2 demonstrates improved compatibility with SiN of a formulation of the disclosure containing two corrosion inhibitors.

Example 3

Formulations Examples 5-8 and Comparative Formulation Example 2 were prepared according to General Procedure 1, and evaluated according to General Procedures 2 and 3. The results are summarized in Table 3.

TABLE 3

| Formulation [wt %] | Comparative Formulation Example 2 | Formulation Example 5 | Formulation Example 6 | Formulation Example 7 | Formulation Example 8 |
|---|---|---|---|---|---|
| HF | 0.50% | 0.50% | 0.50% | 0.50% | 0.50% |
| TPGME (Tripropylene glycol methyl ether) | 49.07% | 48.97% | 48.87% | 48.77% | 48.67% |
| DEGEE (Diethylene glycol ethyl ether) | 49.07% | 48.97% | 48.87% | 48.77% | 48.67% |
| 5-MBTA | | 0.20% | 0.40% | 0.60% | 0.80% |
| Additional water | 0.84% | 0.84% | 0.84% | 0.84% | 0.84% |
| Water from HF aqueous | 0.52% | 0.52% | 0.52% | 0.52% | 0.52% |
| Total | 100% | 100% | 100% | 100% | 100% |
| TiO$_2$ [200 Å], Å/min | 7.1 ± 0.3 | 5.4 ± 0.1 | 4.6 ± 0.1 | 3.0 ± 0.1 | 2.1 ± 0.0 |
| Co [200 Å], Å/min | 1.7 ± 0.1 | 0.3 ± 0.0 | 0.2 ± 0.1 | 0.2 ± 0.1 | 0.2 ± 0.1 |
| Temperature [C.] | 45 | 45 | 45 | 45 | 45 |
| Observation | clear | clear | clear | clear | clear |

5-MBTA = 5-methylbenzotriazole

Table 3 demonstrates markedly improved TiO$_2$ and Co etch rates for formulations of the disclosure containing two solvents and a corrosion inhibitor, compared to a two solvent formulation without a corrosion inhibitor.

Example 4

To further elaborate on the compositions of this disclosure, additional formulation examples are set forth in Table 4.

TABLE 4

| Form. Ex. | HF | C.I. | C.I. | Organic Solvent | Organic Solvent | H$_2$O |
|---|---|---|---|---|---|---|
| FE-9 | 0.50% HF | phthalic anhydride 0.01% | 0.25% BTA | EGBE 51% | DEGEE 47.72% | 0.52% |
| FE-10 | 0.50% HF | 2-sulfobenzoic anhydride 0.01% | 0.25% BTA | cyclo-hexanone 50% | TPGME 48.72% | 0.52% |
| FE-11 | 0.50% HF | benzoic anhydride 0.02% | 0.25% BTA | DEGEE 52% | TPGME 46.71% | 0.52% |
| FE-12 | 0.50% HF | phthalic anhydride 0.4% | 0.25% 5MBTA | EGBE 47% | DEGEE 88.71% | 0.52% |
| FE-13 | 0.50% HF | 2-sulfobenzoic anhydride 0.3% | 0.20% BTA | 2-ethoxy-1-propanol 48% | TPGME 50.48% | 0.52% |
| FE-14 | 0.50% HF | benzoic anhydride 0.2% | 0.10% 1-hydroxy BTA | diethylene glycol mono-butylether 49% | EGBE 49.68% | 0.52% |
| FE-15 | 0.50% HF | phthalic anhydride 0.25% | 0.40% 4-methyl BTA | ethylene glycol mono n-propyl ether 50% | DEGEE 48.33% | 0.52% |
| FE-16 | 0.50% HF | 2-sulfobenzoic anhydride 0.25% | 0.50% 5-amino tetrazole | diethylene glycol 51% | EGBE 47.23% | 0.52% |
| FE-17 | 0.50% HF | benzoic anhydride 0.35% | 1.0% 4-nitro BTA | 3-methoxy-1-butanol 52% | TPGME 45.63% | 0.52% |

DEGEE = Diethylene glycol ethyl ether
TPGME = Tripropylene glycol methyl ether
EGBE = Ethylene glycol butyl ether
C.I. = Corrosion inhibitor While the invention has been described in detail with reference to certain embodiments thereof, it will be understood that modifications and variations are within the spirit and scope of that which is described and claimed.

What is claimed is:

1. A cleaning composition comprising:
   a) HF;
   b) at least one organic solvent in an amount of at least about 95 wt% of the composition;
   c) at least one corrosion inhibitor selected from the group consisting of triazoles, aromatic anhydrides, and combinations thereof; and
   d) water.

2. The composition of claim 1, wherein the at least one organic solvent comprises a solvent selected from the group consisting of alcohols, ketones, ethers, and esters.

3. The composition of claim 1, wherein the at least one organic solvent comprises a solvent selected from the group consisting of alcohols.

4. The composition of claim 3, wherein the at least one organic solvent comprises an alkane diol.

5. The composition of claim 3, wherein the at least one organic solvent comprises an alkylene glycol.

6. The composition of claim 5, wherein the alkylene glycol is selected from the group consisting of ethylene glycol, propylene glycol, diethylene glycol, dipropylene glycol, triethylene glycol, and tetraethylene glycol.

7. The composition of claim 6, wherein the alkylene glycol is dipropylene glycol.

8. The composition of claim 1, wherein the at least one organic solvent comprises a solvent selected from the group consisting of ethers.

9. The composition of claim 8, wherein the at least one organic solvent comprises a solvent selected from the group consisting of glycol ethers.

10. The composition of claim 9, wherein the glycol ether is selected from the group consisting of ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

11. The composition of claim 10, wherein the glycol ether is tripropylene glycol monomethyl ether or dipropylene glycol monoethyl ether.

12. The composition of claim 1, wherein the at least one organic solvent comprises a solvent selected from the group consisting of ketones.

13. A cleaning composition comprising:
    a) HF;
    b) at least one organic solvent;
    c) at least one corrosion inhibitor selected from the group consisting of triazoles, aromatic anhydrides, and combinations thereof; and
    d) water,
    wherein the at least one organic solvent comprises a solvent selected from the group consisting of cyclic ketones.

14. The composition of claim 13, wherein the cyclic ketone is cyclohexanone.

15. The composition of claim 1, comprising at least two organic solvents.

16. A cleaning composition comprising:
    a) HF;
    b) at least two organic solvents;
    c) at least one corrosion inhibitor selected from the group consisting of triazoles, aromatic anhydrides, and combinations thereof; and
    d) water,
    wherein the at least two organic solvents comprise cyclohexanone and dipropylene glycol.

17. The composition of claim 15, wherein the at least two organic solvents comprise tripropyleneglycol methyl ether and diethyleneglycol ethyl ether.

18. The composition of claim 1, wherein the at least one organic solvent comprises DMSO.

19. The composition of claim 1, wherein the at least one corrosion inhibitor comprises a substituted or unsubstituted benzotriazole.

20. The composition of claim 19, wherein the at least one corrosion inhibitor comprises a benzotriazole optionally substituted by at least one substituent selected from the group consisting of alkyl groups, aryl groups, halogen groups, amino groups, nitro groups, alkoxy groups, and hydroxyl groups.

21. The composition of claim 19, wherein the substituted or unsubstituted benzotriazole is selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl) aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

22. The composition of claim 1, wherein the at least one corrosion inhibitor comprises a benzoic anhydride, a phthalic anhydride, or 2-sulfobenzoic anhydride.

23. The composition of claim 1, wherein the at least one corrosion inhibitor is in an amount of from about 0.05% to about 1% by weight of the composition.

24. The composition of claim 1, wherein the water is in an amount of from about 0.5 wt% to about 2 wt% of the composition.

25. The composition of claim 1, wherein the HF is in an amount of from about 0.05 wt% to about 1 wt% of the composition.

26. A method for cleaning a semiconductor substrate, comprising:
    contacting the semiconductor substrate containing post etch residues or post ash residues with the cleaning composition of claim 1.

27. The method of claim 26, further comprising rinsing the semiconductor substrate with a rinse solvent after the contacting step.

28. An article formed by the method of claim 26, wherein the article is a semiconductor device.

29. The article of claim 28, wherein the semiconductor device is an integrated circuit.

30. The composition of claim 1, wherein the composition comprises:
    a) HF in an amount of from about 0.05 wt% to about 1 wt% of the composition;
    b) at least one organic solvent in an amount of at least about 95 wt% of the composition;
    c) at least one corrosion inhibitor selected from the group consisting of triazoles, aromatic anhydrides, and combinations thereof, the at least one corrosion inhibitor being in an amount of from about 0.05% to about 1% by weight of the composition; and
    d) water in an amount of from about 0.5 wt% to about 2 wt% of the composition.

31. A composition, consisting of:
    a) HF;
    b) at least one organic solvent;
    c) at least one corrosion inhibitor selected from the group consisting of triazoles, aromatic anhydrides, and combinations thereof; and
    d) water.

32. The composition of claim 30, wherein the at least one organic solvent comprises a solvent selected from the group consisting of alcohols, ketones, ethers, and esters.

33. The composition of claim 30, wherein the at least one organic solvent comprises a solvent selected from the group consisting of alcohols.

34. The composition of claim 33, wherein the at least one organic solvent comprises an alkane diol.

35. The composition of claim 33, wherein the at least one organic solvent comprises an alkylene glycol.

36. The composition of claim 35, wherein the alkylene glycol is selected from the group consisting of ethylene glycol, propylene glycol, diethylene glycol, dipropylene glycol, triethylene glycol, and tetraethylene glycol.

37. The composition of claim 36, wherein the alkylene glycol is dipropylene glycol.

38. The composition of claim 30, wherein the at least one organic solvent comprises a solvent selected from the group consisting of ethers.

39. The composition of claim 38, wherein the at least one organic solvent comprises a solvent selected from the group consisting of glycol ethers.

40. The composition of claim 39, wherein the glycol ether is selected from the group consisting of ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

41. The composition of claim 40, wherein the glycol ether is tripropylene glycol monomethyl ether or dipropylene glycol monoethyl ether.

42. The composition of claim 30, wherein the at least one organic solvent comprises a solvent selected from the group consisting of ketones.

43. The composition of claim 30, wherein the at least one organic solvent comprises a solvent selected from the group consisting of cyclic ketones.

44. The composition of claim 43, wherein the cyclic ketone is cyclohexanone.

45. The composition of claim 30, comprising at least two organic solvents.

46. The composition of claim 45, wherein the at least two organic solvents comprise cyclohexanone and dipropylene glycol.

47. The composition of claim 45, wherein the at least two organic solvents comprise tripropyleneglycol methyl ether and diethyleneglycol ethyl ether.

48. The composition of claim 30, wherein the at least one organic solvent comprises DMSO.

49. The composition of claim 30, wherein the at least one corrosion inhibitor comprises a substituted or unsubstituted benzotriazole.

50. The composition of claim 49, wherein the at least one corrosion inhibitor comprises a benzotriazole optionally substituted by at least one substituent selected from the group consisting of alkyl groups, aryl groups, halogen groups, amino groups, nitro groups, alkoxy groups, and hydroxyl groups.

51. The composition of claim 49, wherein the substituted or unsubstituted benzotriazole is selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl) aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

52. The composition of claim 30, wherein the at least one corrosion inhibitor comprises a benzoic anhydride, a phthalic anhydride, or 2-sulfobenzoic anhydride.

53. The composition of claim 30, wherein the at least one corrosion inhibitor is in an amount of from about 0.05% to about 0.7% by weight of the composition.

54. The composition of claim 31, wherein the at least one organic solvent comprises a solvent selected from the group consisting of alcohols, ketones, ethers, and esters.

55. The composition of claim 31, wherein the at least one organic solvent comprises a solvent selected from the group consisting of alcohols.

56. The composition of claim 55, wherein the at least one organic solvent comprises an alkane diol.

57. The composition of claim 55, wherein the at least one organic solvent comprises an alkylene glycol.

58. The composition of claim 57, wherein the alkylene glycol is selected from the group consisting of ethylene glycol, propylene glycol, diethylene glycol, dipropylene glycol, triethylene glycol, and tetraethylene glycol.

59. The composition of claim 58, wherein the alkylene glycol is dipropylene glycol.

60. The composition of claim 31, wherein the at least one organic solvent comprises a solvent selected from the group consisting of ethers.

61. The composition of claim 60, wherein the at least one organic solvent comprises a solvent selected from the group consisting of glycol ethers.

62. The composition of claim 61, wherein the glycol ether is selected from the group consisting of ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

63. The composition of claim 62, wherein the glycol ether is tripropylene glycol monomethyl ether or dipropylene glycol monoethyl ether.

64. The composition of claim 31, wherein the at least one organic solvent comprises a solvent selected from the group consisting of ketones.

65. The composition of claim 31, wherein the at least one organic solvent comprises a solvent selected from the group consisting of cyclic ketones.

66. The composition of claim 65, wherein the cyclic ketone is cyclohexanone.

67. The composition of claim 30, wherein the at least one organic solvent comprises at least two organic solvents.

68. The composition of claim 57, wherein the at least two organic solvents comprise cyclohexanone and dipropylene glycol.

69. The composition of claim 67, wherein the at least two organic solvents comprise tripropyleneglycol methyl ether and diethyleneglycol ethyl ether.

70. The composition of claim 31, wherein the at least one organic solvent comprises DMSO.

71. The composition of claim 31, wherein the at least one organic solvent is in an amount of at least 95 wt% of the composition.

72. The composition of claim 31, wherein the at least one corrosion inhibitor comprises a substituted or unsubstituted benzotriazole.

73. The composition of claim 72, wherein the at least one corrosion inhibitor comprises a benzotriazole optionally substituted by at least one substituent selected from the group consisting of alkyl groups, aryl groups, halogen groups, amino groups, nitro groups, alkoxy groups, and hydroxyl groups.

74. The composition of claim 72, wherein the substituted or unsubstituted benzotriazole is selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

75. The composition of claim 31, wherein the at least one corrosion inhibitor comprises a benzoic anhydride, a phthalic anhydride, or 2-sulfobenzoic anhydride.

76. The composition of claim 31, wherein the at least one corrosion inhibitor is in an amount of from about 0.05% to about 1% by weight of the composition.

77. The composition of claim 31, wherein the water is in an amount of from about 0.5 wt% to about 2 wt% of the composition.

78. The composition of claim 31, wherein the HF is in an amount of from about 0.05 wt% to about 1 wt% of the composition.

* * * * *

UNITED STATES PATENT AND TRADEMARK OFFICE
CERTIFICATE OF CORRECTION

Page 1 of 1

PATENT NO. : 10,619,126 B2
APPLICATION NO. : 15/743529
DATED : April 14, 2020
INVENTOR(S) : Yasuo Sugishima, Keeyoung Park and Thomas Dory It is certified that error appears in the above-identified patent and that said Letters Patent is hereby corrected as shown below:

In the Specification

Column 1
Line 5, delete "APPLICATION APPLICATIONS" and insert -- APPLICATIONS --

In the Claims

Column 12
Line 2, in Claim 21, delete "diimethylpropyl" and insert -- dimethylpropyl --

Column 14
Line 3, in Claim 51, delete "diimethylpropyl" and insert -- dimethylpropyl --

Column 16
Line 11, in Claim 74, delete "diimethylpropyl" and insert -- dimethylpropyl --

Signed and Sealed this
Twenty-sixth Day of May, 2020

Andrei Iancu
*Director of the United States Patent and Trademark Office*